(12) United States Patent
Tseng et al.

(10) Patent No.: US 10,163,692 B2
(45) Date of Patent: Dec. 25, 2018

(54) STRUCTURE AND FORMATION METHOD OF INTERCONNECTION STRUCTURE OF SEMICONDUCTOR DEVICE STRUCTURE

(71) Applicant: Taiwan Semiconductor Manufacturing Co., Ltd., Hsinchu (TW)

(72) Inventors: Lee-Chuan Tseng, New Taipei (TW); Chang-Ming Wu, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/453,505

(22) Filed: Mar. 8, 2017

(65) Prior Publication Data

US 2018/0261501 A1    Sep. 13, 2018

(51) Int. Cl.
 *H01L 23/48* (2006.01)
 *H01L 23/52* (2006.01)
 *H01L 21/768* (2006.01)
 *H01L 23/528* (2006.01)

(52) U.S. Cl.
 CPC .. *H01L 21/76834* (2013.01); *H01L 21/76885* (2013.01); *H01L 23/5283* (2013.01)

(58) Field of Classification Search
 CPC ............... H01L 23/528; H01L 23/5226; H01L 23/5283; H01L 21/76885; H01L 21/76835; H01L 21/76834
 USPC ......................................................... 257/775
 See application file for complete search history.

(56) References Cited

U.S. PATENT DOCUMENTS 5,874,358 A * 2/1999 Myers ............... H01L 21/32133
257/E21.309
2013/0109151 A1* 5/2013 Hsu ................... H01L 21/76232
438/424

* cited by examiner

*Primary Examiner* — Theresa T Doan
(74) *Attorney, Agent, or Firm* — Birch, Stewart, Kolasch & Birch, LLP

(57) ABSTRACT

Structures and formation methods of a semiconductor device structure are provided. The semiconductor device structure includes a substrate having a first top surface, and an interconnection line over the first top surface of the substrate. The interconnection line has a sidewall. The semiconductor device structure also includes a first spacer over the sidewall of the interconnection line. The first spacer has a first concave surface which concaves towards the sidewall of the interconnection line. The semiconductor device structure further includes a dielectric layer covering the substrate, the interconnection line and the first spacer.

20 Claims, 6 Drawing Sheets

STRUCTURE AND FORMATION METHOD OF INTERCONNECTION STRUCTURE OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor device structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
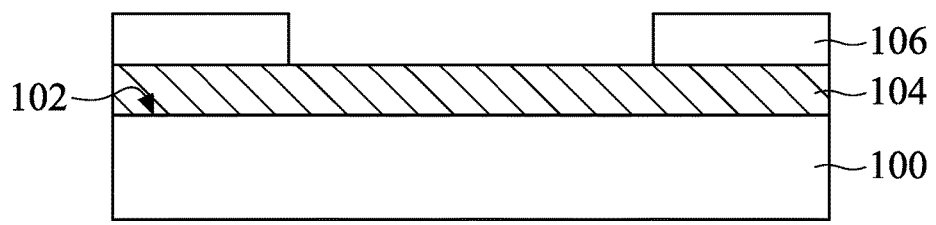
FIGS. 1A-1D are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1D are cross-sectional views of various stages of a process for forming a semiconductor device structure, in accordance with some embodiments. As shown in FIG. 1A, a semiconductor substrate 100 is received or provided, in accordance with some embodiments. In some embodiments, the semiconductor substrate 100 has a first top surface 102. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 100 is an un-doped substrate. However, in some other embodiments, the semiconductor substrate 100 is a doped substrate such as a P-type substrate or an N-type substrate.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, the semiconductor substrate 100 includes an interconnection structure. The interconnection structure also includes multiple conductive features formed in the interlayer dielectric layers. The conductive features may include conductive lines, conductive vias, and/or conductive contacts.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

The device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

In some embodiments, the semiconductor substrate 100 is a complementary metal oxide semiconductor (CMOS) substrate. In some other embodiments, the semiconductor substrate 100 is a MEMS (Micro-Electro-Mechanical System) substrate.

As shown in FIG. 1A, a conductive layer 104 is deposited over the semiconductor substrate 100, in accordance with some embodiments. In some embodiments, the conductive layer 104 is made of a metal material, another suitable conductive material, or a combination thereof. In some embodiments, the metal material includes, but is not limited to, copper, aluminum, tungsten, molybdenum, titanium, tantalum, platinum, hafnium, alloys thereof, another suitable material, or a combination thereof. In some embodiments, the conductive layer 104 is made of aluminum-copper alloy (AlCu).

In some embodiments, the applicable deposition methods for depositing the conductive layer 104 include a chemical vapor deposition (CVD), a physical vapor deposition (PVD) process, or another applicable method.

As shown in FIG. 1A, a mask element 106 is formed over the conductive layer 104, in accordance with some embodiments. In some embodiments, the mask element 106 is made of a dielectric material. The dielectric material includes silicon oxide, silicon nitride, silicon oxynitride, silicon carbide, another suitable dielectric material, or a combination thereof.

In some embodiments, a mask material layer is deposited over the conductive layer 104. The mask material layer may be deposited by using a chemical vapor deposition (CVD) process, a physical vapor deposition (PVD) process, a spin-on process, another applicable process, or a combination thereof.

Afterwards, the mask material layer is partially removed by using a photolithography process and an etching process. For example, a patterned photoresist layer (not shown) is formed on the mask material layer. The portion of the mask material layer not covered by the photoresist layer is etched. As a result, the mask element 106 is formed.

Figure 1B:
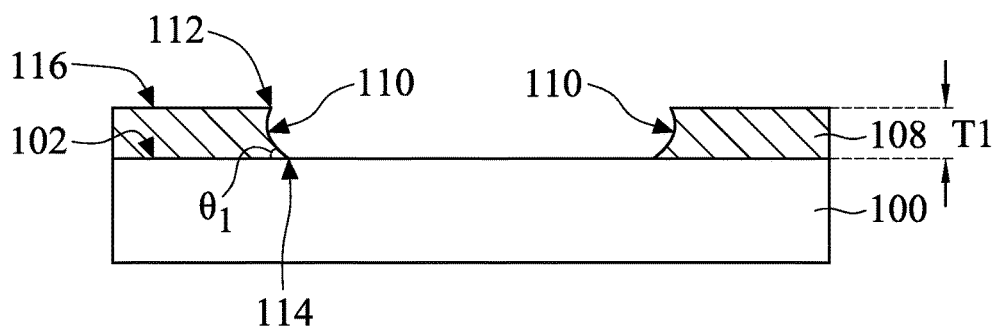

Afterwards, as shown in FIG. 1B, the conductive layer 104 is etched by using the mask element 106 as an etching mask, in accordance with some embodiments. As shown in FIG. 1B, the conductive layer 104 is etched until the first top surface 102 of the semiconductor substrate 100 is exposed, in accordance with some embodiments. The etching process includes a wet etching process, a dry etching process, or a combination thereof.

As shown in FIG. 1B, the remaining portion of the conductive layer 104 forms an interconnection line 108 over the first top surface 102 of the semiconductor substrate 100, in accordance with some embodiments. In some embodiments, the interconnection line 108 is made of a metal material, another suitable conductive material, or a combination thereof. In some embodiments, the metal material includes, but is not limited to, copper, aluminum, tungsten, molybdenum, titanium, tantalum, platinum, hafnium, alloys thereof, another suitable material, or a combination thereof. In some embodiments, the interconnection line 108 is made of aluminum-copper alloy (AlCu).

As shown in FIG. 1B, the interconnection line 108 has a sidewall 110, in accordance with some embodiments. In some embodiments, the interconnection line 108 is formed by performing a wet etching to the conductive layer 104. In these embodiments, the sidewall 110 of the interconnection line 108 has a concave cross-sectional profile, as shown in FIG. 1B.

However, the embodiments of the present disclosure are not limited thereto. In some other embodiments, the sidewall 110 of the interconnection line 108 has a straight cross-sectional profile.

As shown in FIG. 1B, the sidewall 110 of the interconnection line 108 has a first upper edge 112 and a first lower edge 114, in accordance with some embodiments. As shown in FIG. 1B, the interconnection line 108 has a second top surface 116. As shown in FIG. 1B, the second top surface 116 of the interconnection line 108 is connected to the sidewall 110 at the first upper edge 112, in accordance with some embodiments. As shown in FIG. 1B, the sidewall 110 of the interconnection line 108 is in contact with the first top surface 102 of the semiconductor substrate 100 at the first lower edge 114, in accordance with some embodiments.

As shown in FIG. 1B, an acute angle between the sidewall 110 of the interconnection line 108 and the first top surface 102 of the semiconductor substrate 100 at the first lower edge 114 is a first angle $\theta 1$, in accordance with some embodiments. In some embodiments, the first angle $\theta 1$ is in a range from about 65 degrees to about 85 degrees, for example, from about 70 degrees to about 80 degrees.

In some embodiments, the thickness T1 of the interconnection line 108 is in a range from about 100 nm to about 2 μm, for example, from about 500 nm to about 1 μm.

It should be noted that, if the thickness T1 of the interconnection line 108 is too great, for example greater than about 2 μm, the geometric size (i.e., the smallest component (or line) that can be created using a fabrication process) may not be effectively decreased. However, if the thickness T1 of the interconnection line 108 is too small, for example smaller than about 100 nm, the semiconductor device structure might be negatively affected too.

Afterwards, as shown in FIG. 1B, the mask element 106 is removed, in accordance with some embodiments. In some embodiments, an etching process is used to remove the mask element 106. The etching process includes a wet etching process, a dry etching process, or a combination thereof.

Figure 1C:
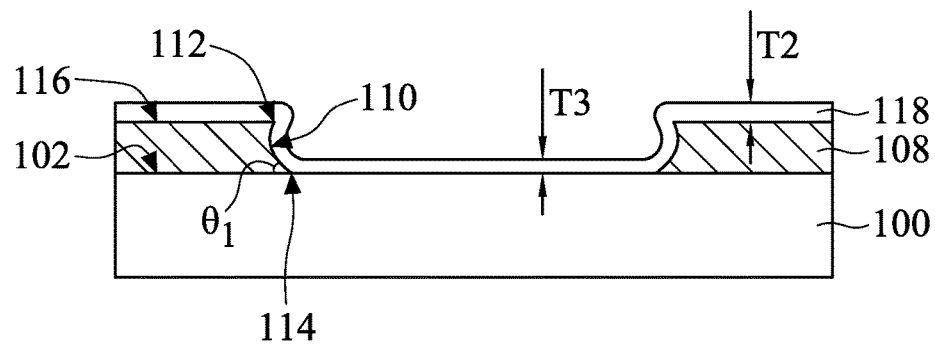

Afterwards, as shown in FIG. 1C, a first spacer material layer 118 is conformally deposited over the semiconductor substrate 100 and the interconnection line 108, in accordance with some embodiments. As shown in FIG. 1C, the first spacer material layer 118 covers the second top surface 116 and the sidewall 110 of the interconnection line 108, in accordance with some embodiments.

In some embodiments, the first spacer material layer 118 is made of silicon oxide, silicon nitride, silicon oxynitride, silicon carbide, another suitable material, or a combination thereof. In some embodiments, the first spacer material layer 118 is deposited using a CVD process, a PVD process, a spin-on coating process, another applicable process, or a combination thereof.

In some embodiments, as shown in FIG. 1C, the portion of the first spacer material layer 118 over the second top surface 116 of the interconnection line 108 has a thickness T2, in accordance with some embodiments. As shown in FIG. 1C, the portion of the first spacer material layer 118 over the first top surface 102 of the semiconductor substrate 100 but not over the second top surface 116 of the interconnection line 108 has a thickness T3, in accordance with some embodiments. As shown in FIG. 1C, the thickness T2 is greater than the thickness T3, in accordance with some embodiments.

In other words, the portion of the first spacer material layer 118 which is in direct contact with the second top surface 116 of the interconnection line 108 has a thickness T2, as shown in FIG. 1C in accordance with some embodiments. As shown in FIG. 1C, the portion of the first spacer material layer 118 which is in direct contact with the first top surface 102 of the semiconductor substrate 100 but does not come into contact with the second top surface 116 of the interconnection line 108 has a thickness T3, in accordance with some embodiments.

Figure 1D:
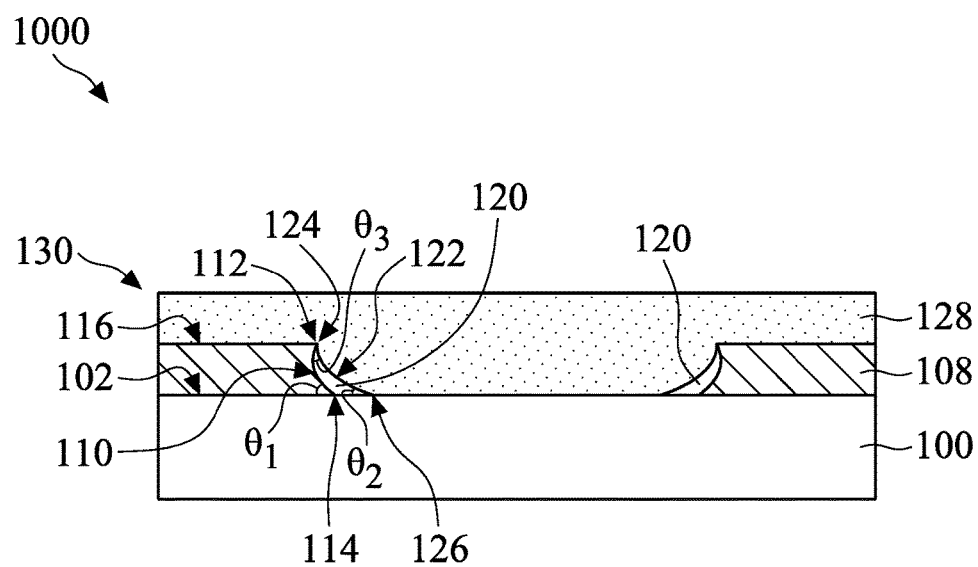

Afterwards, as shown in FIG. 1D, the first spacer material layer 118 is etched to form a first spacer 120 over the sidewall 110 of the interconnection line 108 and over a portion of the semiconductor substrate 100, in accordance with some embodiments. As shown in FIG. 1D, the first spacer 120 does not cover the second top surface 116 of the interconnection line 108, in accordance with some embodiments. As shown in FIG. 1D, some portions of the semiconductor substrate 100 are not covered by the first spacer 120, in accordance with some embodiments.

In some embodiments, a single wet etching process is performed to etch the first spacer material layer 118 and form the first spacer 120. In some other embodiments, the first spacer material layer 118 is partially dry etched first, then the partially dry etched first spacer material layer 118 is wet etched to form the first spacer 120.

As shown in FIG. 1D, the first spacer 120 has a first concave surface 122 which concaves towards the sidewall 110 of the interconnection line 108, in accordance with some embodiments. In some embodiments of the present disclosure, as shown in FIG. 1D, the first concave surface 122 is oriented towards the sidewall 110 of the interconnection line 108.

As shown in FIG. 1D, the first concave surface 122 of the first spacer 120 has a second upper edge 124 and a second lower edge 126, in accordance with some embodiments. As shown in FIG. 1D, the first concave surface 122 of the first spacer 120 is in contact with the first top surface 102 of the substrate 100 at the second lower edge 126, in accordance with some embodiments.

As shown in FIG. 1D, an acute angle between the first concave surface 122 of the first spacer 120 and the first top surface 102 of the substrate 100 at the second lower edge 126 is a second angle θ 2, in accordance with some embodiments. In some embodiments, the second angle θ 2 is in a range from about 10 degrees to about 60 degrees, for example, from about 20 degrees to about 50 degrees. As shown in FIG. 1D, the second angle θ 2 is smaller than the first angle θ 1, in accordance with some embodiments.

As shown in FIG. 1D, the second upper edge 124 of the first concave surface 122 of the first spacer 120 is in contact with the first upper edge 112 of the sidewall 110 of the interconnection line 108, in accordance with some embodiments.

As shown in FIG. 1D, an acute angle between the first concave surface 122 of the first spacer 120 and the sidewall 110 of the interconnection line 108 at the first upper edge 112 is a third angle θ 3, in accordance with some embodiments. In some embodiments, the third angle θ 3 is in a range from about 1 degree to about 15 degrees, for example, from about 3 degrees to about 10 degrees.

Afterwards, as shown in FIG. 1D, a dielectric layer 128 is deposited over the substrate 100, the interconnection line 108 and the first spacer 120, in accordance with some embodiments. As shown in FIG. 1D, the dielectric layer 128 covers the substrate 100, the interconnection line 108 and the first spacer 120.

In some embodiments, the dielectric layer 128 is made of silicon oxide, silicon nitride, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric layer 128 is deposited using a CVD process, an ALD process, a spin-on process, a spray coating process, another applicable process, or a combination thereof.

In some embodiments, the material of the first spacer 120 is the same as that of the dielectric layer 128. However, in some other embodiments, the material of the first spacer 120 is different from that of the dielectric layer 128.

As shown in FIG. 1D, the interconnection line 108, the first spacer 120 and the dielectric layer 128 together form an interconnection structure 130 of semiconductor device structure 1000, in accordance with some embodiments.

In some cases, the first spacer is not formed. In these cases, a seam may be formed in the dielectric layer due to the steep sidewall of the interconnection line which intersects the semiconductor substrate at the first angle.

In some embodiments, the first spacer covers the steep sidewall of the interconnection line, and the first concave surface 122 of the first spacer 120 is more tapered than the sidewall of the interconnection line. In other words, the second angle between the first concave surface 122 and the semiconductor substrate 100 is smaller than the first angle. Due to the first concave surface 122 of the first spacer 120 which is more tapered than the sidewall of the interconnection line, the seam formation may be reduced or may be prevented. Therefore, the structural reliability of the semiconductor device structure 1000 may be improved.

It should be noted that, if the second angle θ 2 is too great, for example greater than about 60 degrees, the seam formation may not be effectively reduced. However, if the second angle θ 2 is too small, for example smaller than about 10 degrees, the geometric size (i.e., the smallest component (or line) that can be created using a fabrication process) may not be effectively decreased.

It should be noted that, if the third angle θ 3 is too great, for example greater than about 15 degrees, the geometric size (i.e., the smallest component (or line) that can be created using a fabrication process) may not be effectively decreased. However, if the third angle θ 3 is too small, for example smaller than about 1 degree, the seam formation may not be effectively reduced.

Figure 2:
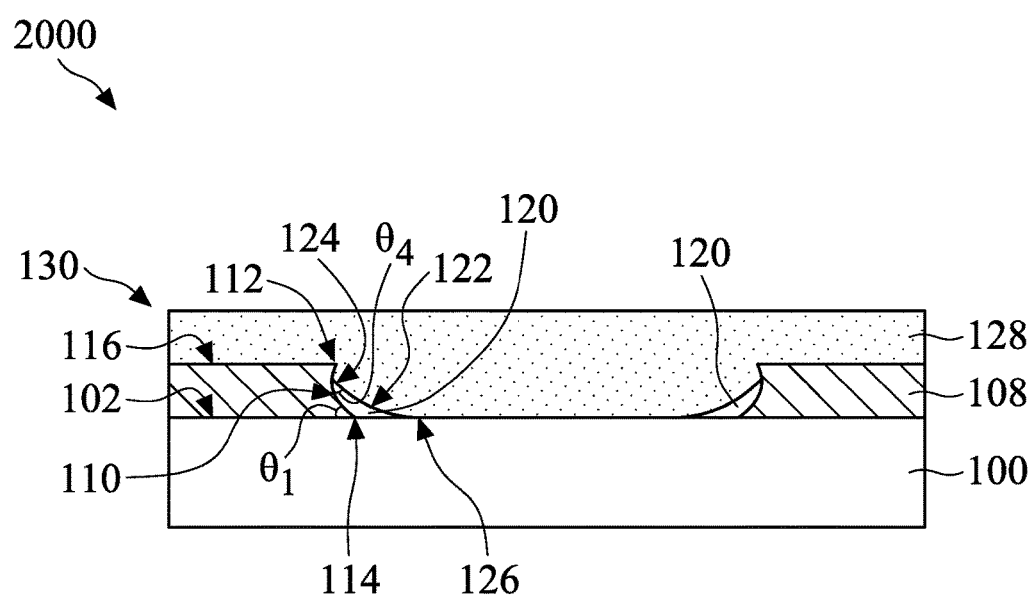
FIG. 2 is a cross-sectional view of a semiconductor device structure in accordance with some embodiments.

It should be noted that the exemplary embodiment set forth in FIGS. 1A-1D is merely for the purpose of illustration. In addition to the embodiment set forth in FIGS. 1A-1D, the first spacer could have other configuration as shown in FIG. 2. This will be described in more detail in the following description. Therefore, the present disclosure is not limited to the exemplary embodiment shown in FIGS. 1A-1D.

FIG. 2 is a cross-sectional view of a semiconductor device structure 2000 in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiment shown in FIG. 2 and the embodiment shown in FIG. 1D is that the first spacer 120 partially covers the sidewall 110 of the interconnection line 108, in accordance with some embodiments. As shown in FIG. 2, the second upper edge 124 of the first concave surface 122 of the first spacer 120 is in contact with the sidewall 110 of the interconnection line 108, but is not in contact with the first upper edge 112 of the sidewall 110 of the interconnection line 108.

As shown in FIG. 2, an acute angle between the first concave surface 122 of the first spacer 120 and the sidewall 110 of the interconnection line 108 at the second upper edge 124 is a fourth angle θ 4, in accordance with some embodiments. In some embodiments, the fourth angle θ 4 is in a range from about 3 degrees to about 20 degrees, for example, from about 5 degrees to about 10 degrees.

It should be noted that, if the fourth angle θ 4 is too great, for example greater than about 20 degrees, the geometric size (i.e., the smallest component (or line) that can be created using a fabrication process) may not be effectively decreased. However, if the fourth angle θ 4 is too small, for example smaller than about 3 degrees, the seam formation may not be effectively reduced.

Figure 3A:
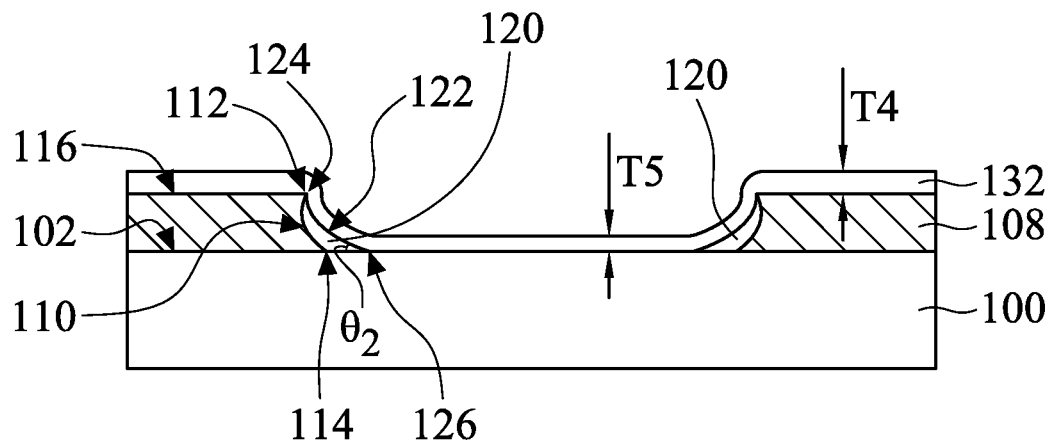
FIGS. 3A-3B are cross-sectional views of various stages of a process for forming a semiconductor device structure, in accordance with some embodiments.
Figure 3B:
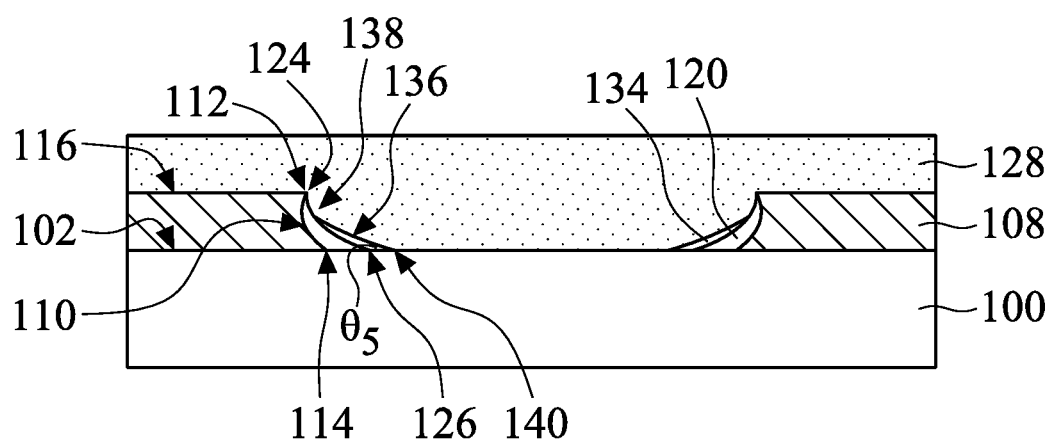

FIGS. 3A-3B are cross-sectional views of various stages of a process for forming a semiconductor device structure 3000, in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 3A, after forming the first spacer 120, and before forming the dielectric layer 128, a second spacer material layer 132 is conformally deposited over the semiconductor substrate 100, the interconnection line 108 and the first spacer 120, in accordance with some embodiments.

As shown in FIG. 3A, the second spacer material layer 132 covers the second top surface 116 of the interconnection line 108 and the first concave surface 122 of the first spacer 120, in accordance with some embodiments.

In some embodiments, the second spacer material layer 132 is made of silicon oxide, silicon nitride, silicon oxynitride, silicon carbide, another suitable material, or a combination thereof. In some embodiments, the second spacer material layer 132 is deposited using a CVD process, a PVD process, a spin-on coating process, another applicable process, or a combination thereof.

In some embodiments, the material of the second spacer material layer 132 is the same as the material of the first spacer 120. However, in some other embodiments, the material of the second spacer material layer 132 is different from the material of the first spacer 120.

In some embodiments, as shown in FIG. 3A, the portion of the second spacer material layer 132 over the second top surface 116 of the interconnection line 108 has a thickness T4, in accordance with some embodiments. As shown in FIG. 3A, the portion of the second spacer material layer 132 over the first top surface 102 of the semiconductor substrate 100 but not over the second top surface 116 of the interconnection line 108 has a thickness T5, in accordance with some embodiments. As shown in FIG. 3A, the thickness T4 is greater than the thickness T5, in accordance with some embodiments.

In other words, the portion of the second spacer material layer 132 which is in direct contact with the second top surface 116 of the interconnection line 108 has a thickness T4, as shown in FIG. 3A in accordance with some embodiments. As shown in FIG. 3A, the portion of the second spacer material layer 132 which is in direct contact with the first top surface 102 of the semiconductor substrate 100 but does not come into contact with the second top surface 116 of the interconnection line 108 has a thickness T5, in accordance with some embodiments.

Afterwards, as shown in FIG. 3B, the second spacer material layer 132 is etched to form a second spacer 134 over the first concave surface 122 of the first spacer 120 and over a portion of the semiconductor substrate 100, in accordance with some embodiments.

In some embodiments, the second spacer 134 is made of silicon oxide, silicon nitride, silicon oxynitride, silicon carbide, another suitable material, or a combination thereof. In some embodiments, the material of the second spacer 134 is the same as the material of the first spacer 120. However, in some other embodiments, the material of the second spacer 134 is different from the material of the first spacer 120.

As shown in FIG. 3B, the second spacer 134 does not cover the second top surface 116 of the interconnection line 108, in accordance with some embodiments. As shown in FIG. 3B, some portions of the semiconductor substrate 100 are not covered by the second spacer 134, in accordance with some embodiments.

In some embodiments, a single wet etching process is performed to etch the second spacer material layer 132 and form the second spacer 134. In some other embodiments, the second spacer material layer 132 is partially dry etched first, then the partially dry etched second spacer material layer 132 is wet etched to form the second spacer 134.

As shown in FIG. 3B, the second spacer 134 has a second concave surface 136 which concaves towards the first concave surface 122 of the first spacer 120, in accordance with some embodiments.

As shown in FIG. 3B, the second concave surface 136 of the second spacer 134 has a third upper edge 138 and a third lower edge 140, in accordance with some embodiments.

As shown in FIG. 3B, the second concave surface 136 of the second spacer 134 is in contact with the first top surface 102 of the semiconductor substrate 100 at the third lower edge 140, in accordance with some embodiments.

As shown in FIG. 3B, an acute angle between the second concave surface 136 of the second spacer 134 and the first top surface 102 of the substrate 100 at the third lower edge 140 is a fifth angle θ 5, in accordance with some embodiments. In some embodiments, the fifth angle θ 5 is in a range from about 5 degrees to about 50 degrees, for example, from about 10 degrees to about 40 degrees.

As shown in FIG. 3B, the fifth angle θ 5 is smaller than the second angle θ 2, in accordance with some embodiments. In some embodiments, since the fifth angle θ 5 is smaller than the second angle θ 2, the seam formation may be further reduced or may be prevented. Therefore, the structural reliability of the semiconductor device structure 1000 may be improved further.

It should be noted that, if the fifth angle θ 5 is too great, for example greater than about 50 degrees, the seam formation may not be effectively reduced. However, if the fifth angle θ 5 is too small, for example smaller than about 5 degrees, the geometric size (i.e., the smallest component (or line) that can be created using a fabrication process) may not be effectively decreased.

As shown in FIG. 3B, the second spacer 134 partially covers the first spacer 120 and the semiconductor substrate 100. In other words, in some embodiments, the third upper edge 138 of the second spacer 134 is not in contact with the second upper edge 124 of the first spacer 120.

Afterwards, as shown in FIG. 3B, a dielectric layer 128 is deposited over the substrate 100, the interconnection line 108, the first spacer 120 and the second spacer 134, in accordance with some embodiments. As shown in FIG. 3B, the dielectric layer 128 covers the substrate 100, the interconnection line 108, the first spacer 120 and the second spacer 134.

In some embodiments, the dielectric layer 128 is made of silicon oxide, silicon nitride, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric layer 128 is deposited using a CVD process, an ALD process, a spin-on process, a spray coating process, another applicable process, or a combination thereof.

In some embodiments, the material of the second spacer 134 is the same as that of the dielectric layer 128. However, in some other embodiments, the material of the second spacer 134 is different from that of the dielectric layer 128.

It should be noted that the exemplary embodiments set forth in FIGS. 1A-3B are merely for the purpose of illustration. In addition to the embodiments set forth in FIGS. 1A-3B, the semiconductor device structure may include three or more spacers over the sidewall of the interconnection line. Therefore, the present disclosure is not limited to the exemplary embodiments shown in FIGS. 1A-3B.

Figure 4:
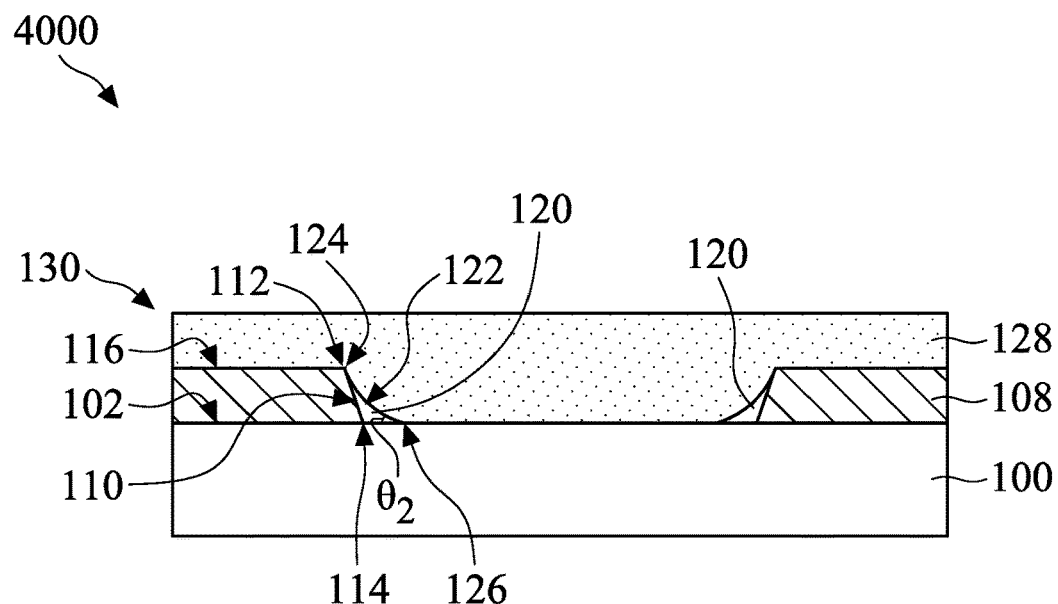
FIG. 4 is a cross-sectional view of a semiconductor device structure in accordance with some embodiments.

FIG. 4 is a cross-sectional view of a semiconductor device structure 4000 in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 4, the interconnection line 108 is formed by performing a dry etching to the conductive layer 104 shown in FIG. 1A. In these embodiments, the sidewall 110 of the interconnection line 108 has a straight cross-sectional profile, as shown in FIG. 4.

Figure 5A:
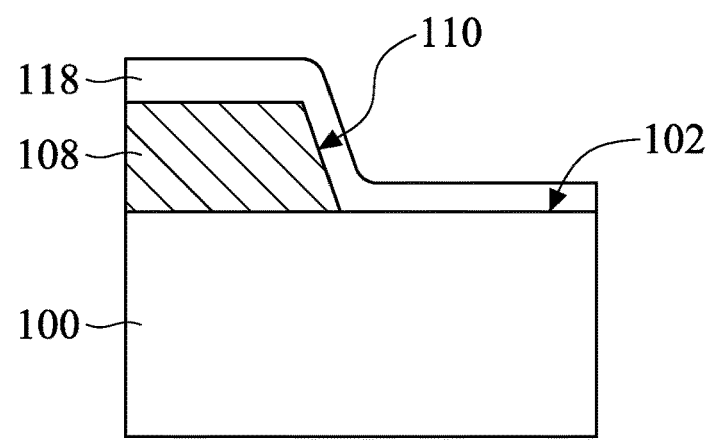
FIGS. 5A-5C are cross-sectional views of various stages of a process for forming a semiconductor device structure, in accordance with some embodiments.
Figure 5B:
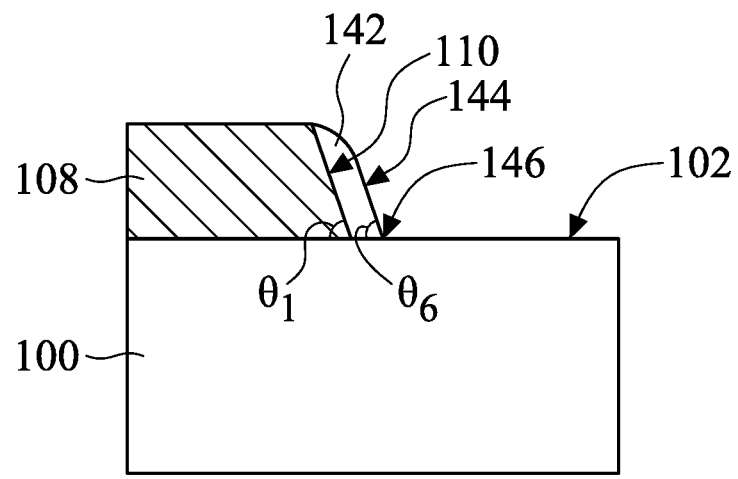
Figure 5C:
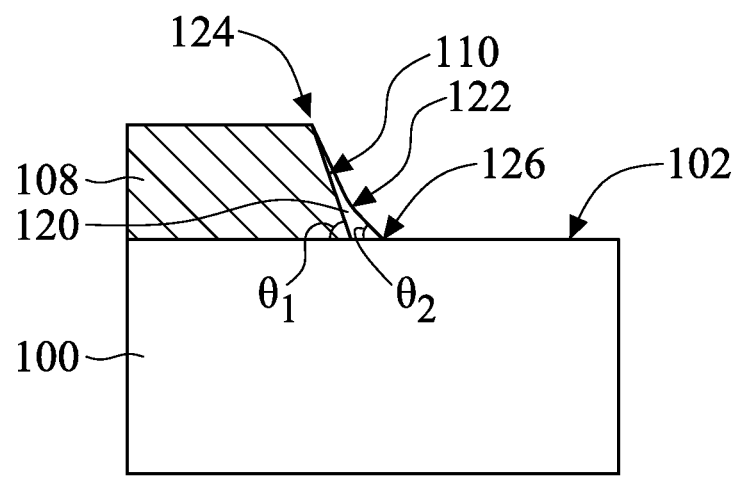

FIGS. 5A-5C are cross-sectional views of various stages of a process for forming the first spacer, in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity. As shown in FIG. 5A, the first spacer material layer 118 is conformally deposited over the semiconductor substrate 100 and the interconnection line 108, in accordance with some embodiments.

Afterwards, as shown in FIG. 5B, the first spacer material layer 118 is dry etched to partially etch the first spacer material layer 118, in accordance with some embodiments. As shown in FIG. 5B, after the dry etch process, the remaining portion 142 of the first spacer material layer 118 is left over the sidewall 110 of the interconnection line 108 and over a portion of the semiconductor substrate 100, in accordance with some embodiments.

As shown in FIG. 5B, the remaining portion 142 of the first spacer material layer 118 has a third surface 144, in accordance with some embodiments. As shown in FIG. 5B, the third surface 144 is in contact with the first top surface 102 of the semiconductor substrate 100 at a fourth lower edge 146, in accordance with some embodiments. As shown in FIG. 5B, the third surface 144 is a convex surface, in accordance with some embodiments.

As shown in FIG. 5B, an acute angle between the third surface 144 of the remaining portion 142 of the first spacer material layer 118 and the first top surface 102 of the semiconductor substrate 100 at the fourth lower edge 146 is a sixth angle θ 6, in accordance with some embodiments. In some embodiments, the sixth angle θ 6 is substantially same as the first angle θ 1. In some embodiments, the sixth angle θ 6 is in a range from about 65 degrees to about 85 degrees, for example, from about 70 degrees to about 80 degrees.

Afterwards, as shown in FIG. 5C, the remaining portion 142 of the first spacer material layer 118 is wet etched to form the first spacer 120 with the first concave surface 122, in accordance with some embodiments.

As shown in FIG. 5C, the first concave surface 122 of the first spacer 120 is in contact with the first top surface 102 of the semiconductor substrate 100 at a second lower edge 126, in accordance with some embodiments. As shown in FIG. 5C, an acute angle between the first concave surface 122 of the first spacer 120 and the first top surface 102 of the semiconductor substrate 100 at the second lower edge 126 is the second angle θ 2, in accordance with some embodiments. As shown in FIG. 5C, the second angle θ 2 is smaller than the sixth angle θ 6, in accordance with some embodiments.

However, the embodiments of the present disclosure are not limited thereto. In some other embodiments, a single wet etching process is performed to etch the first spacer material layer 118 shown in FIG. 5A and form the first spacer 120 with the first concave surface 122 shown in FIG. 5C.

In some embodiments, the second spacer is formed by the method similar to or the same as that described above. This will not be repeated for the sake of brevity.

Embodiments of the disclosure use a first spacer to cover the sidewall of the interconnection line. In some embodiments, the first concave surface of the first spacer is more tapered than the sidewall of the interconnection line. In other words, the second angle between the first concave surface and the semiconductor substrate is smaller than the first angle. Due to the first concave surface of the first spacer which is more tapered than the sidewall of the interconnection line, the seam formation may be reduced or may be prevented. Therefore, the structural reliability of the semiconductor device structure may be improved.

In accordance with some embodiments, a semiconductor device structure is provided. The semiconductor device structure includes a substrate having a first top surface, and an interconnection line over the first top surface of the substrate. The interconnection line has a sidewall. The semiconductor device structure also includes a first spacer over the sidewall of the interconnection line. The first spacer has a first concave surface which concaves towards the sidewall of the interconnection line. The semiconductor device structure further includes a dielectric layer covering the substrate, the interconnection line and the first spacer.

In accordance with some embodiments, a semiconductor device structure is provided. The semiconductor device structure includes a substrate having a first top surface, and an interconnection line over the first top surface of the substrate. The interconnection line has a sidewall with a first upper edge and a first lower edge. The sidewall of the interconnection line is in contact with the first top surface of the substrate at the first lower edge. The semiconductor device structure also includes a first spacer over the sidewall of the interconnection line and over the substrate. The first spacer has a first concave surface with a second upper edge and a second lower edge. The first concave surface of the first spacer is in contact with the first top surface of the substrate at the second lower edge. An acute angle between the sidewall of the interconnection line and the first top surface of the substrate at the first lower edge is a first angle, and an acute angle between the first concave surface of the first spacer and the first top surface of the substrate at the second lower edge is a second angle. The second angle is smaller than the first angle.

In accordance with some embodiments, a method for forming a semiconductor device structure is provided. The method includes providing a substrate having a first top surface, and forming an interconnection line over the first top surface of the substrate. The interconnection line has a sidewall. The method also includes depositing a first spacer material layer over the substrate and the interconnection line, and etching the first spacer material layer to form a first spacer over the sidewall of the interconnection line and over the substrate. The first spacer has a first concave surface which concaves towards the sidewall of the interconnection line. The method further includes forming a dielectric layer covering the substrate, the interconnection line and the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a substrate having a first top surface;
   forming an interconnection line over the first top surface of the substrate, wherein the interconnection line has a sidewall;
   depositing a first spacer material layer over the substrate and the interconnection line;
   etching the first spacer material layer to expose the first top surface of the substrate and to form a first spacer over the sidewall of the interconnection line and over the substrate, wherein the first spacer has a first concave surface which concaves towards the sidewall of the interconnection line; and
   forming a dielectric layer covering the substrate, the interconnection line and the first spacer.

2. The method as claimed in claim 1, wherein before forming the dielectric layer, the method further comprises:
   depositing a second spacer material layer over the substrate, the interconnection line and the first spacer; and
   etching the second spacer material layer to form a second spacer over the first concave surface of the first spacer and over the substrate, wherein the second spacer has a second concave surface which concaves towards the first concave surface of the first spacer.

3. The method as claimed in claim 1, wherein the etching process which etches the first spacer material layer to form the first spacer comprises:
   dry etching the first spacer material layer to partially etch the first spacer material layer and leave a remaining portion of the first spacer material layer over the sidewall of the interconnection line and over the substrate; and
   wet etching the remaining portion of the first spacer material layer to form the first spacer with the first concave surface.

4. The method as claimed in claim 3, wherein the remaining portion of the first spacer material layer has a third surface which is in contact with the first top surface of the substrate at a fourth lower edge,
   wherein an acute angle between the third surface of the remaining portion of the first spacer material layer and the first top surface of the substrate at the fourth lower edge is a sixth angle,
   wherein the first concave surface of the first spacer is in contact with the first top surface of the substrate at a second lower edge,
   wherein an acute angle between the first concave surface of the first spacer and the first top surface of the substrate at the second lower edge is a second angle,
   wherein the second angle is smaller than the sixth angle.

5. The method as claimed in claim 4, wherein the third surface is a convex surface.

6. The method as claimed in claim 5, wherein the angle between the first concave sidewall and the top surface of the substrate is in a range from about 65 degrees to about 85 degrees.

7. The method as claimed in claim 5, wherein the angle between the second concave sidewall and the top surface of the substrate is in a range from about 10 degrees to about 60 degrees.

8. The method as claimed in claim 5, wherein an angle between the first concave sidewall and the second concave sidewall is in a range from about 10 degrees to about 60 degrees.

9. The method as claimed in claim 5, wherein the first concave sidewall has a first upper edge and a first lower edge, and the second concave sidewall has a second upper edge and a second lower edge, wherein the second upper edge of the second concave sidewall of the first spacer is in contact with the first concave sidewall of the conductive layer but is not in contact with the first upper edge of the first concave sidewall of the conductive layer,
   wherein an angle between the second concave sidewall of the first spacer and the first concave sidewall of the conductive layer at the second upper edge is in a range from about 3 degrees to about 20 degrees.

10. The method as claimed in claim 5, further comprising:
forming a second spacer material layer over a top surface of the conductive layer, the second concave sidewall of the first spacer and the top surface of the substrate; and
etching the second spacer material layer to form a second spacer on the second concave sidewall of the first spacer and the top surface of the substrate, wherein the second spacer has a third concave sidewall and the angle between the second concave sidewall of the first spacer and the top surface of the substrate is greater than an angle between the third concave sidewall of the second spacer and the top surface of the substrate.

11. The method as claimed in claim 10, wherein the angle between the third concave sidewall of the second spacer and the top surface of the substrate is in a range from about 5 degrees to about 50 degrees.

12. The method as claimed in claim 10, wherein the second spacer partially covers the first spacer and the substrate.

13. The method as claimed in claim 12, wherein an upper edge of the third concave sidewall of the second spacer is not in contact with an upper edge of the second concave sidewall of the first spacer.

14. The method as claimed in claim 1, wherein the sidewall of the interconnection line has a concave cross-sectional profile, and the sidewall of the interconnection line is connected to the first top surface of the substrate at a lower edge of the interconnection line.

15. A method for forming a semiconductor device structure, comprising:
forming a conductive layer over a substrate;
etching the conductive layer to form a first concave sidewall;
forming a first spacer material layer over the first concave sidewall; and
etching the first spacer material layer to form a first spacer on the first concave sidewall, wherein the first spacer has a second concave sidewall and an angle between the first concave sidewall and a top surface of the substrate is greater than an angle between the second concave sidewall and the top surface of the substrate.

16. A method for forming a semiconductor device structure, comprising:
forming a conductive layer over a substrate;
etching the conductive layer to form a first concave sidewall;
forming a spacer material layer over the first concave sidewall and a top surface of the conductive layer; and
etching the spacer material layer to expose the top surface and an upper portion of the first concave sidewall of the conductive layer, so that a spacer is formed over a bottom portion of the first concave sidewall, wherein the spacer has a second concave sidewall.

17. The method as claimed in claim 16, wherein an angle between the second concave sidewall and a top surface of the substrate is smaller than an angle between the first concave sidewall and the top surface of the substrate.

18. The method as claimed in claim 16, further comprising forming a dielectric layer covering the substrate, the conductive layer and the spacer.

19. The method as claimed in claim 18, wherein the material of the spacer is the same as that of the dielectric layer.

20. The method as claimed in claim 18, wherein the material of the spacer is different from that of the dielectric layer.

* * * * *